United States Patent [19]

Burr et al.

[11] 4,065,850

[45] Jan. 3, 1978

[54] METHOD OF MAKING MULTI-WIRE ELECTRICAL INTERCONNECTING MEMBER HAVING A MULTI-WIRE MATRIX OF INSULATED WIRES MECHANICALLY TERMINATED THEREON

[75] Inventors: Robert Page Burr, Huntington; Ronald Morino, Sea Cliff; Raymond J. Keogh, Huntington, all of N.Y.

[73] Assignee: Kollmorgen Technologies Corporation, Dallas, Tex.

[21] Appl. No.: 604,204

[22] Filed: Aug. 13, 1975

[51] Int. Cl.² .................. H05K 3/10; H01R 43/00
[52] U.S. Cl. ........................... 29/625; 29/628; 174/68.5; 339/97 R; 339/99 R
[58] Field of Search .............. 29/625, 628, 630 B, 29/630 D; 174/68.5, 117 PC, 117 A; 339/97 R, 97 P, 98 R, 99 R, 17 R, 17 B

[56] References Cited

U.S. PATENT DOCUMENTS

| 3,445,929 | 5/1969 | Wolf ........................................ 29/625 |
| 3,636,500 | 1/1972 | Sedlacek ............................. 339/97 R |
| 3,674,914 | 7/1972 | Burr ...................................... 174/68.5 |
| 3,805,214 | 4/1974 | Demler et al. ......................... 339/17 |
| 3,820,058 | 6/1974 | Friend ................................ 339/99 R |
| 3,912,354 | 10/1975 | Campbell et al. ................. 339/99 R |

Primary Examiner—Victor A. DiPalma

[57] ABSTRACT

A multi-wire electrical interconnecting circuit member having a multi-wire matrix of insulated wires mechanically terminated on the multi-wire electrical interconnecting member. Wire retaining members positioned on the multi-wire electrical interconnecting member terminate the wires and establish a gas-tight electrical connection therewith. Each of the wire retaining members includes means for engaging a wire with sufficient force to penetrate any insulation thereon and establish and maintain a gas-tight electrical connection with the conductive core of the wire.

5 Claims, 16 Drawing Figures

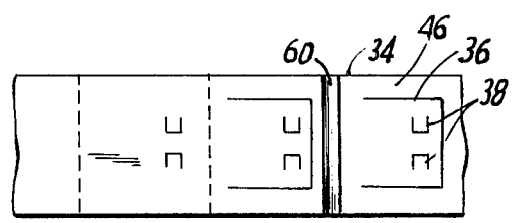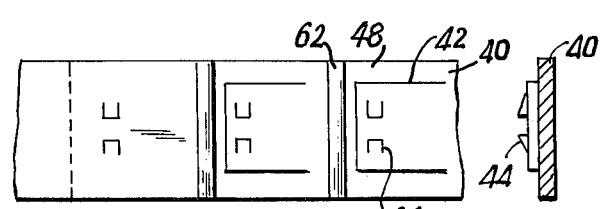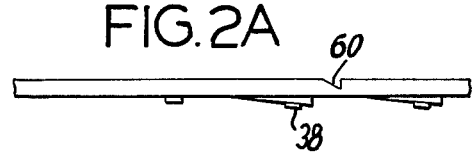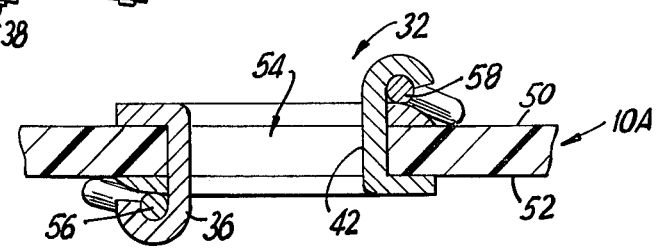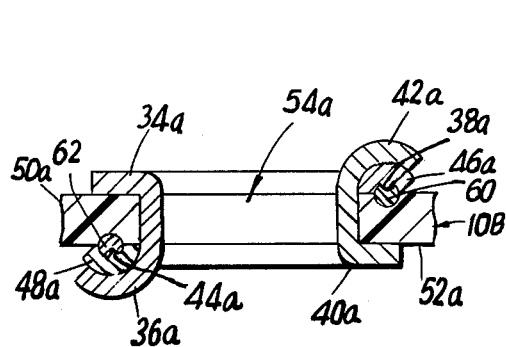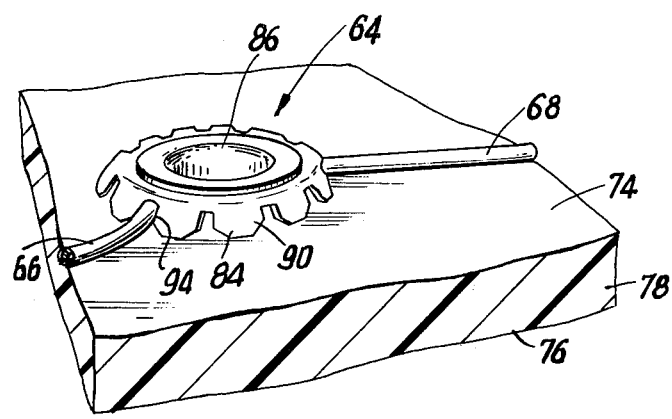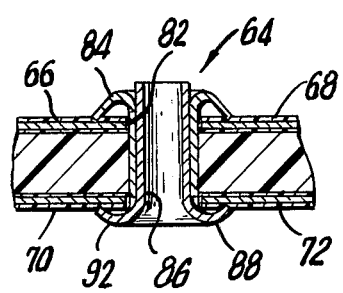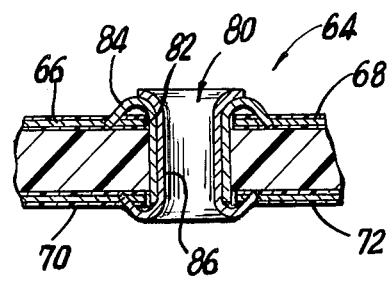

METHOD OF MAKING MULTI-WIRE ELECTRICAL INTERCONNECTING MEMBER HAVING A MULTI-WIRE MATRIX OF INSULATED WIRES MECHANICALLY TERMINATED THEREON

The present invention relates to electrical interconnecting members, and more specifically to a multi-wire electrical interconnecting member having a multi-wire matrix of insulated wires mechanically terminated thereon. The terms "termination" or "terminated" as used in this specification relate to mechanical and electrical termination, and it should be understood that these terms cover wire which physically ends at points in the multi-wire matrix or which extends beyond these points.

Since the development of multi-wire circuit boards as disclosed in U.S. Pat. No. 3,674,914 (R. P. Burr), the need to provide gas-tight electrical terminations between the insulated wire of a multi-wire matrix and the holes of a circuit board was recognized. In the aforementioned patent, the termination of the wires is effected by chemical metallization (electroless deposition). However, for certain applications, it is desirable to terminate the wires by means other than chemical metallization.

It is an object of the present invention to provide termination of the insulated wires of a multi-wire matrix circuit member by mechanical retaining members that are electrically joined to the matrix.

It is a further object of the present invention to provide mechanical retaining members for a multi-wire matrix circuit member which utilize existing circuit member components.

It is a still further object of the present invention to provide mechanical retaining members which provide gas-tight electrical connections with the insulated wires of a multi-wire circuit member.

It is a still further object of the present invention to provide a mechanical retaining member for stripping or displacing the insulation from the insulated wires of a multi-wire circuit member to effect gas-tight electrical connection with the conductive core of the insulated wires.

Other objects, aspects, and advantages of the present invention will be apparent when the detailed description is considered with the drawing.

Briefly, the multi-wire electrical interconnection circuit member according to the present invention includes a multi-wire matrix having insulated wires mounted on the multi-hole circuit board and terminated thereon, wire retaining members positioned on the multi-wire electrical interconnection member to provide termination of the wires of the multi-wire matrix, each of the wire retaining members including means for engaging an insulated wire with sufficient force to penetrate any insulation thereon and establish a gas-tight electrical connection therewith while mechanically retaining the insulated wire.

The present invention is illustrated in the accompanying drawings, in which:

FIG. 2a is a top plan view of a top strip for mechanical termination;

FIG. 2b is a side view of the top strip shown in FIG. 2a;

FIG. 3a is a top plan view of a bottom strip for mechanical termination;

FIG. 3b is a side view of the bottom strip shown in FIG. 3a;

FIG. 4 is a partial cross-sectional view of a wire retaining member comprising the top and bottom strips inserted in a hole of the multi-wire circuit member and terminating an insulated wire;

FIG. 5 is a partial cross-sectional view of a modification of terminating strips of FIG. 4;

FIG. 6 is a perspective view of a wire retaining eyelet according to the present invention;

FIG. 7 is a partial sectional view of the wire retaining eyelet of FIG. 6 positioned in a hole prior to crimping;

FIG. 8 is a sectional view of the wire retaining eyelet of FIG. 7 after crimping;

Figure 1:
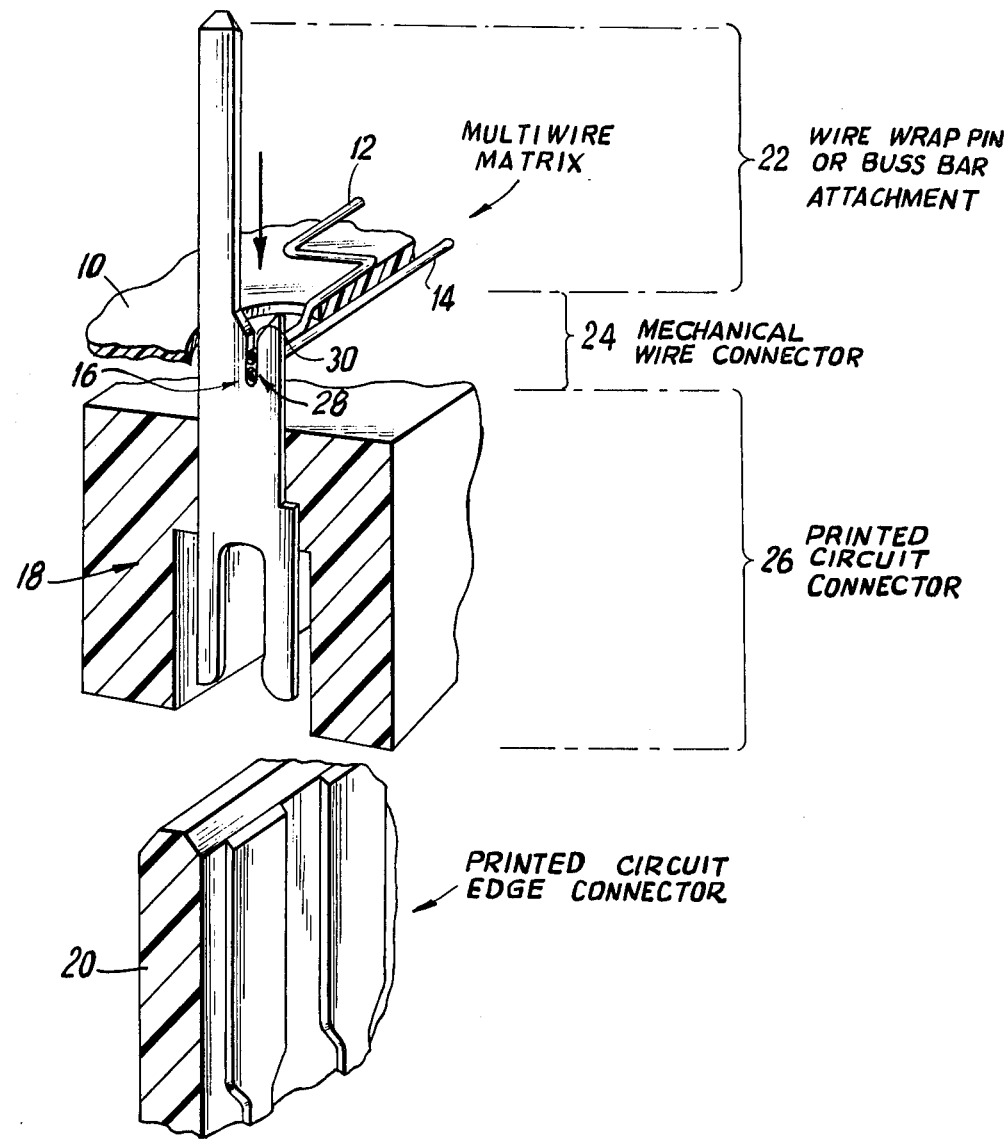
FIG. 1 is an exploded view of a multi-wire circuit member with a wire retaining pin in accordance with the present invention.
Figure 9:
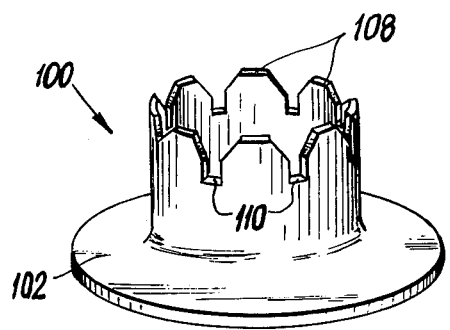
FIG. 9 is a perspective view of a modification of a portion of the wire retaining eyelet of FIGS. 6-8, for use with multi-wire circuit members having wire scribed on only one surface.
Figure 10:
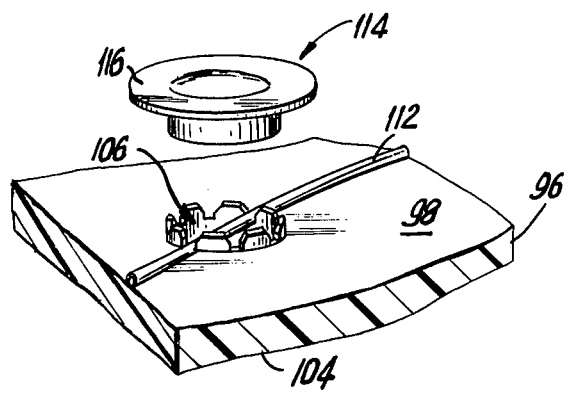
FIG. 10 is an exploded perspective view of the wire retaining eyelet of FIG. 9 inserted in a hole of a multi-hole circuit member with the top portion of the eyelet ready for insertion therein to form an interference fit therewith.
Figure 11:
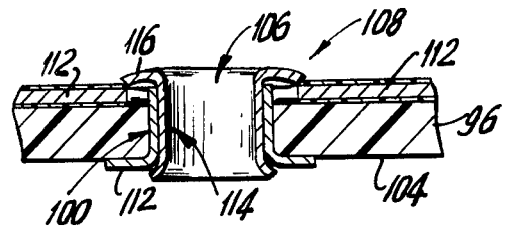
FIG. 11 is a partial cross-section view of the assembled eyelet of FIG. 9 after crimping.
Figure 13:
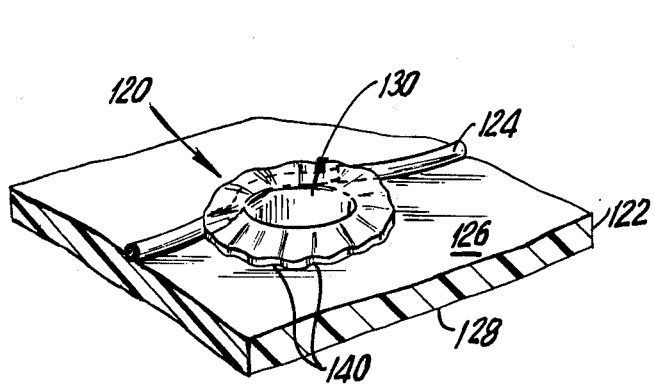
Figure 12:
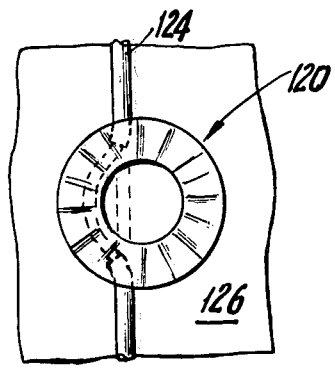
FIG. 12 is a top plan view of a modified wire retaining eyelet for insulated wires which are offset relative to the center of the holes of a multi-wire circuit member and having portions of the insulation removed at the holes.
Figure 14:
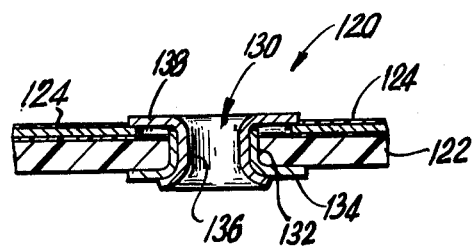

FIG. 13 is a perspective view of the wire retaining eyelet of FIG. 12 inserted in the hole of a multi-wire circuit member and terminating an insulated wire; and FIG. 14 is a partial cross-sectional view of the assembled wire retaining eyelet of FIG. 12 after crimping Referring to FIG. 1, a wire electrical interconnection circuit member, e.g., a multi-hole circuit board, in accordance with the present invention is illustrated at 10. The multi-hole circuit board 10 includes a plurality of scribed wires only two of which, 12 and 14, are shown. The insulated wires 12 and 14, which may take the form of rigid or flexible wires, form a portion of a multi-wire matrix. The multi-wire matrix is formed by suitably programmed multi-wiring machines, e.g., of the type disclosed in U.S. Pat. No. 3,674,914 (R. P. Burr). However, it should be understood that any suitably programmed multi-wiring machine may be employed to form the multi-wire matrix. Moreover, a multi-wire matrix may be formed on both surfaces of the circuit board 10 as shown in FIG. 1 or on one side only as shown in FIGS. 9-11. Additionally, multi-levels of circuit boards 10 may be utilized.

Prior to forming the desired multi-wire matrix, the circuit board 10, generally in the form of a thin flexible or rigid substrate, is coated with a suitable adhesive, e.g., RC-205, manufactured by the Photocircuits Division of Kollmorgen Corporation, on one or both sides as desired. The suitably programmed multi-wiring machine then forms the desired matrix or matrices.

In some applications, FIGS. 1, 2a-5, and FIGS. 12-14, the circuit board is pre-drilled or punched at all terminating positions prior to wiring. For other applications, FIGS. 6-8, the multi-wire matrix is formed and the circuit board is then drilled or punched at the location of all desired terminations. With still other applications in which wire is scribed on only one surface of the circuit board, FIGS. 9–11, no drilling or punching of the circuit board is required but instead after the multi-wire matrix is scribed on the adhesive coated circuit board, the circuit board is mounted on an N/C table for positioning each terminating location at a work station. At each terminating location, a wire retaining member is forced through the substrate from the unwired side to form a termination.

Again referring to FIG. 1, a terminal pin 16 of a molded plastic printed circuit connector 18 for connecting a printed circuit edge connector 20 is illustrated. The terminal pin 16 includes an upper portion 22 for wire wrap of bus bar attachment, an intermediate portion 24 for terminating the wires 12 and 14, and a lower portion 26 for connection to the printed circuit edge connector 20.

The intermediate portion 24 includes a slot 28 having a tapered or beveled entrant end 30 for readily receiving the wires 12 and 14. The slot 28 is dimensioned so that its edges apply sufficient force to the insulated wires 12 and 14, upon insertion therein, to displace or penetrate the insulation and establish a gas-tight electrical connection with the conductors of the wires 12 and 14. The wires 12 and 14 are positively retained on both sides of the slot 28, as shown in FIG. 1, and good electrical contact is established and maintained between the conductor of the wires 12 and 14 and the terminal pin 16. Thus, the wires 12 and 14 are mechanically terminated via a gas-tight electrical connection without the need to utilize electroless deposition or solder.

Referring to FIGS. 2a and b, FIGS. 3a and b, and FIG. 4, a two piece strip retaining member 32 is illustrated. A top strip 34, e.g., 1/16 inch × 1/16 inch, is formed by a punch and includes a large cut-out C-shaped flap 36 with a pair of small C-shaped protrusions or teeth 38 formed adjacent to the open end of the cut-out flap 35. A bottom strip 40 similar to the top strip 34 is also formed with a punch except that its cut-out flap 42, with protrusions 44, is formed to bend in the opposite direction. The top and bottom strips 34 and 40 are dimensioned so that their non-cut-out portions 46 and 48 serve as flanges when the strips 34 and 40 abut the top and bottom surfaces 50 and 52, respectively, of the circuit board 10A when the flaps 36 and 42 are inserted into a square hole 54.

A first tool moves the wire 56 inwardly into position in grooves or slants 60 and 62 of strips 34 and 40 and another tool inserted into the hole 54 deflects the cut-out 36 of the top strip 34 downwardly to grab the wire 56. The free end of the cut-out 36 is wrapped partially around the wire 56 so that the protrusions 38 pierce the insulation of the insulated wire to establish gas-tight electrical connection with the conductor of the insulated wire 56; therefore, the wire 56 is retained tangent to the hole 54. The same sequence is applied to install the bottom strip 40 except that the cut out 42 is bent upwardly to establish a gas-tight electrical connection with the conductor of the insulated wire 58 on the top surface 50. Advantageously, the cut outs 36 and 42 are dimensioned to extend through the hole 54 and partially wrap around wires 56 and 58 to grip the wires 56 and 58 and hole them between the grooves 60 and 62 of the non-cut-out portions 46 and 48 and the ends of the cut-outs 36 and 42. The non-cut-out portions or flanges 46 and 48 extend beyond the edges of the hole 54 to aid in firmly maintaining the position of the strips 34 and 40 at the hole 54 after crimping.

Alternatively, as shown in FIG. 5, by including the protrusions 38a and 44a on the underside of the non-cut out portions 46a and 48a of the strips 34a and 40a, the strips 34a and 40 are positioned in the square hole 54a after forming the multi-wire matrix and the wires scribed adjacent the hole 54a are then retained below the non-cut out portions 46a and 48a. The cut-out portions 36a and 42a are crimped about the non-cut our portions 36a and 42a to retain the wires 60 and 62 between the surfaces 50a and 52a of the circuit board 106 and the non-cut-out portions 36a and 42a, and provide a gas-tight electrical connection between the conductors of the insulated wires 60 and 62 and the non-cut out portions 36a and 42a.

Referring to FIGS. 6–8, a wire retaining eyelet 64 is shown for terminating the insulated wires 66 and 68 and 70 and 72 of multi-wire matrices formed on both sides 74 and 76 of a circuit board 78. The circuit board 78 is coated with an adhesive on both sides 74 and 76, as desired. A multi-wire matrix is formed on both sides 74 and 76 and the circuit board 78 is drilled at the location of all desired terminations. The wire retaining eyelet 64 is positioned in the terminating hole 80. The eyelet 64 includes a first cylindrical member 82 with a flange 84 at one end and a second cylindrical member 86, having a longer cylindrical portion, with a flange 88 at one end. The flanges 84 and 88 of each of the cylindrical members 82 and 86 are bent downwardly and include serrations 90 and 92 with slots 94 dimensioned to strip or displace the insulation and hold the wires 66 and 68. The first cylindrical member 82 is inserted from the top surface 74 into the hole 80 and the slots 94 receive the insulated wires 66 and 68 on the top surface 74 of the circuit board 78. The second cylindrical member 86 is inserted into the hole 80 from the underside of the current board 78 and the slots 94 receive the insulated wires 70 and 72 of the circuit board 78. The second cylindrical member 86 has an outer diameter smaller than the inner diameter of the cylindrical first member 82 so that it extends through the first cylindrical member. The assembled wire retaining eyelet 64 shown in FIG. 7 is crimped by a suitable inserting tool into the position shown in FIG. 8, so that the insulated is displaced to provide a gas-tight electrical connection between the conductors 66, 68, 70, and 72 terminating at the hole 80.

Referring to FIGS. 9–11, a modification of the eyelet 64 of FIGS. 6–8 is shown for terminating a multi-wire circuit board 96 having wire inscribed on only one surface 98. The circuit board 96 is wired on one surface, as shown top surface 98, but not drilled. The multi-wire circuit board 96 is mounted on an N/C table for successively positioning each desired terminating point in the circuit board 96 at a work station. At each successive terminating point, a first cylindrical member 100 having a flange 102 at one end is inserted into the circuit board 96 from it underside 104, thereby forming a circuit board 96 from its underside 104, thereby forming a terminating hole 106, see FIG. 10. The end of the cylindrical member 100 remote from the flange 102 includes serration 108 which cuts theough the substrate. Adjacent each serration 108 is a slot 110 which grips the insulated wire 112 and penetrates the insulation to establish electrical contact with the conductive core of the insulated wire 112. A second cylindrical member 114 having an outside diameter smaller than the inside diameter of the first cylindrical member 100 is then inserted into the circuit board 96 from the opposite end and extends therethrough. The second cylindrical member 114 has a flange 116 at one end which abuts the top surface 98 of the circuit board 96. Insertion of the second cylindrical member 114 enables the end remote from the flange 116 to cut the bridging section of the insulated wire 112 and forces out a small circular plug from the board to form a terminating hole 106. The eyelet 118 is crimped into position as shown in FIG. 11 to retain the wire 112 in gas-tight electrical contact therewith.

Referring to FIGS. 12–14, another variation of the wire retaining eyelet is shown. With this wire retaining eyelet 120, the circuit board 122 is coated with an adhesive and drilled or punched at all required terminating positions and wires 124 are scribed on one or both sides 126 and 128. When scribing the wires 124 on the circuit board 122 the wiring datum is translated with respect to the drilling datum so that all wires cross their terminating holes offset in both the X and Y directions from the center of the hole.

Moreover, once the offset multi-wire matrix is completed the circuit board 122 is removed from the wiring machine and the insulation is removed from that portion of the insulated wire 124 which traverses the hole 130. Removal of the insulation may be accomplished either mechanically or chemically. For mechanical removal the multi-wire matrix is placed between two plates, each of which carries a hole pattern identical to the hole pattern of the multi-wire circuit board 126. The holes of the circuit board 126 are registered with the holes in the plates and the circuit board 126 compressed therebetween. A blast of glass beads is directed through each of the registered holes, abrading the insulation therein so that it is cleanly removed.

The eyelet 120 includes a first cylindrical member 132 having a flange 134 at one end. The first cylindrical member 132 is inserted into the hole 130 from the bottom surface 128 of the circuit board 122 and its flange rests against the bottom surface 128 of the circuit board 122. A second cylindrical member 136 having a flange 138 at one end is inserted into the hole. The second cylindrical member 136 has an outer diameter smaller than the inner diameter of the first cylindrical member 132 for insertion of the second cylindrical member 136 into the hole 130. The second cylindrical member 136 is inserted from the top surface 126 and the flange rests thereagainst. The offset wires 124 extending across the hole 130 from the top and bottom surfaces 126 and 128 are displaced generally tangent to the hole 130 by the cylindrical member 136 and 132, respectively. Advantageously, the flanges 134 and 138 of the cylindrical members 132 and 136, respectively, include radial undulations or serrations 140, see FIG. 13, for gripping and forming a gas-tight electrical connection with the exposed conductors of the insulated wire 124 upon crimping, see FIG. 14.

It is apparent from the foregoing description that a novel mechanically terminated multi-wire circuit board has been provided which eliminates the need to use chemical metallization or soldering to terminate the multi-wire matrix. A gas-tight electrical connection is obtained by insertion of a wire retaining member into the circuit board. Such a wire retaining member may be formed in some cases with only slight modification to existing terminal pin structures. It should be understood by those skilled in the art that various modifications may be made in the present invention without departing from the spirit and scope thereof, as described in the specification and defined in the appended claims.

What is claimed is:

1. A method of mechanically terminating the insulated wires of a multi-wire electrical interconnection circuit member, comprising the steps of:
   scribing wires on the circuit member to form a multi-wire matrix;
   selecting positions in the multi-wire matrix where an electrical connection is desired;
   gripping the insulated wires of the multi-wire matrix and said circuit member at each successive selected position with a gripping member to lock said gripped insulated wires to said circuit member and to prevent movement thereof;
   applying sufficient gripping force to the multi-wire matrix and said circuit member at each successive selected position to provide individual gas-tight electrical connections between said gripping member and said insulated wires; and
   permanently maintaining the applicaton of sufficient gripping force to said gripping member for providing permanent gas-tight electrical connections at the selected positions of the multi-wire matrix.

2. The method claimed in claim 1, including the step of:
   coating the circuit member with an adhesive prior to scribing the wires thereon.

3. The method claimed in claim 1, wherein:
   the selected positions of the multi-wire matrix correspond to the holes formed in the circuit member.

4. The method claimed in claim 1, wherein:
   the gripping and force applying steps are performed simultaneously.

5. The method claimed in claim 3, wherein:
   the wires scribed on the circuit member which intercept the holes are offset relative to the center of the holes.

* * * * *